United States Patent
Mori et al.

[11] Patent Number: 5,175,399
[45] Date of Patent: Dec. 29, 1992

[54] WIRING PANEL INCLUDING WIRING HAVING A SURFACE-REFORMING LAYER AND METHOD FOR PRODUCING THE SAME

[75] Inventors: Mitsumasa Mori; Eishi Gofuku; Mitsuyuki Takada; Kurumi Miyake; Yoshiyuki Morihiro; Masanobu Kohara, all of Amagasaki, Japan

[73] Assignee: Mitsubishi Denki Kabushiki Kaisha, Tokyo, Japan

[21] Appl. No.: 572,245

[22] Filed: Aug. 27, 1990

[30] Foreign Application Priority Data

Aug. 29, 1989 [JP] Japan .................. 1-222221
Jan. 10, 1990 [JP] Japan .................. 2-2879
Jan. 22, 1990 [JP] Japan .................. 2-12836

[51] Int. Cl.⁵ ............................. H05K 1/00
[52] U.S. Cl. .................... 174/256; 174/257; 174/258; 427/400
[58] Field of Search ........... 174/250, 256, 257, 258, 174/255; 156/307.3; 427/98, 99, 302, 96, 304, 305, 400, 306; 204/130

[56] References Cited

U.S. PATENT DOCUMENTS

| | | | |
|---|---|---|---|
| 3,960,573 | 6/1976 | Zeblisky | 427/306 X |
| 4,187,198 | 2/1980 | Zeblisky | 427/306 X |
| 4,350,743 | 9/1982 | Lazzari | 174/256 |
| 4,668,354 | 5/1987 | Levy | 204/130 |
| 4,668,532 | 5/1987 | Moisan et al. | 427/98 X |
| 4,751,126 | 6/1988 | Oodaira et al. | 156/307.3 |
| 4,788,104 | 11/1988 | Adriaensen et al. | 252/512 |

FOREIGN PATENT DOCUMENTS

60-143693 7/1985 Japan .
60-213086 10/1985 Japan .

*Primary Examiner*—Leo P. Picard
*Assistant Examiner*—Trinidod Korka
*Attorney, Agent, or Firm*—Oblon, Spivak, McClelland, Maier & Neustadt

[57] ABSTRACT

Disclosed herein is a wiring panel constructed with a substrate; an electrically conductive member laminated on the substrate and principally composed of copper; and an insulating member composed of an organic substance, wherein a very small amount of a non-metallic element is incorporated into the electrically conductive member, and a very small amount of a metal element is incorporated into the insulating member.

Also disclosed herein is a method for producing a wiring panel constructed with a substrate, an electrically conductive member provided on the substrate and composed of copper as the principal constituent, and an insulating layer of an organic substance covering the conductive member, which comprises steps of: applying onto the surface of the electrically conductive member a surface-reforming layer which functions to suppress electron transfer through the surface of the electrically conductive member, and thereafter forming the organic insulating layer on the electrically conductive member.

16 Claims, 8 Drawing Sheets

WIRING PANEL INCLUDING WIRING HAVING A SURFACE-REFORMING LAYER AND METHOD FOR PRODUCING THE SAME

BACKGROUND OF THE INVENTION

1. Field of the Invention

This invention relates to a wiring panel constructed with laminated layers of an insulating member composed of an organic substance and an electrically conductive member composed of copper as the principal constituent, and also to a method of producing such wiring panel.

2. Description of Prior Arts

In recent years, great demand is imposed on electronic apparatuses and appliances for their densification, miniaturization, and high speed in their operations. For this purpose, wiring panels which constitute an integral part of such electronic apparatuses and appliances are also required to have high density wiring as well as high speed signal transmission capability. In order to meet these requirements, attention has been drawn to copper or copper alloys having low resistivity, as the electrically conductive material, while attention has also been paid on polyimide resin which is capable of high density patterning, has high heat resistance, and has a low dielectric constant, as the insulating material.

Conventional wiring panel such as, for example, one which is described in "Denshi Joho Tsushin Gakkai Ronbun Shi—C (Journal of Electronic Information Communication Society of Japan—C), Vol. J71-C, No. 11 (1988), pp. 1510-1515" is of a construction as shown in FIG. 3 of the accompanying drawing (which is a cross-sectional view), wherein a reference numeral 1 designates a substrate, a reference numeral 4 denotes an electrically conductive layer comprising copper, and a numeral 3 refers to an insulating layer comprising polyimide.

This wiring panel made up of the substrate, copper, and polyimide is manufactured in the following process steps. First of all, a film of high purity copper of 99.99% or higher is formed on the substrate 1 to a predetermined film thickness by the evaporative deposition method. Subsequently, varnish containing therein polyamic acid, which is a precursor of polyimide, is coated over the copper film to a predetermined film thickness, and then the combination is subjected to heat-treatment at a temperature of about 350° C. in a nitrogen atmosphere to change polyamic acid into polyimide, thereby forming the polyimide film. By sequential repetition of the copper film forming step and the polyimide film forming step, multi-layers are formed on the substrate, during which process appropriate patterning is effected on the copper film and the polyimide film to thereby enable a desired wiring panel to be manufactured.

By the way, the wiring panel, particularly the one for use in a high speed computer which is required to transmit high speed signals as they are being kept at high quality, is demanded to have low resistivity ($\Omega$.cm) of the conductive material, low dielectric constant of the insulating material, and further heat-resistance against various heat-treatments. As the conductive materials of low resistivity, there may be exemplified silver, copper, and others. Of these various species, copper is a material next to silver in its low resistivity, and it has electrochemical stability comparable with that of silver, hence it is a material difficult to cause deterioration in its insulation among the wirings. Of various insulating materials, polyimide is one of those small numbers of organic materials having heat-resistance of as high as 300° C. or above and low dielectric constant. On account of this, there has been conducted positive development of the wiring panel made up of copper and polyimide in combination, as in the above-mentioned example.

In the formation of a film of polyimide resin as the insulating layer, it has been a general practice to coat on the substrate a polyamic acid precursor which is soluble in a solvent, and then subject the precursor on the substrate to heat-treatment, thereby converting the polyamic acid precursor to polyimide resin.

There has, however, been a problem such that, since copper and polyamic acid precursor are highly reactive each other, and, in particular, since copper diffuses into polyimide resin at a high temperature condition, the reaction tends to occur readily between copper and polyimide resin with the consequence that polyimide resin decreases its heat-resistance. Further, depending on the state of reaction, there takes place peeling at the interface between copper and polyimide resin with the consequent problem of the combination not functioning as the wiring panel. This reaction between copper and polyimide resin is considered due to decomposition of the imide ring in the polyimide resin.

With a view to solving such point of problem, there have heretofore been devised a wiring panel, as disclosed in a thesis of F. S. Ohuchi, et al., "Journal of Vacuum Science and Technology", A6(3) (1988), pp. 1004-1006, wherein titanium, nickel, or other metal materials is interposed between copper and polyimide resin to thereby suppress diffusion of copper into polyimide. FIG. 4 of the accompanying drawing is a cross-sectional view schematically illustrating the wiring panel, in which a layer 6 of such other material is inserted between the copper layer 4 and the polyimide layer 3.

Furthermore, FIGS. 11 and 12 of the accompanying drawing respectively illustrate the sequential process steps of producing the conventional wiring panel, as disclosed, for example, in Japanese unexamined patent publication No. 151490/1984, which was devised for solving the above-mentioned disadvantages. FIG. 11 is a cross-sectional view of the wiring panel after formation of a different kind of metal film on the surface of the copper conductive wiring, while FIG. 12 is a cross-sectional view showing the wiring panel after patterning of the polyamic acid precursor film on the copper conductive wiring. In the drawing, a reference numeral 1 designates a ceramic substrate, a numeral 4 refers to a copper conductive wiring, a reference numeral 6 denotes a different kind of metal film (e.g., nickel film) as formed on the surface of the copper conductive wiring 4, and a numeral 3 refers to the polyamic acid precursor film as patterned on the copper conductive wiring 4.

This wiring panel is manufactured in such a manner that a different kind of metal film (e.g., nickel film 6) which does not bring about electron transfer between copper and the polyamic acid precursor is formed on the copper conductive wiring 4 (FIG. 11), and then the polyamic acid precursor film 3 is formed on the copper conductive wiring 4 (FIG. 12) to thereby suppress deterioration in the polyamic acid precursor film 3 and formation of a residual film at the time of the patterning.

However, since these other materials such as titanium, nickel, etc. are higher in their resistivity than copper, when they are used as mentioned above, the resistance of the wiring as a whole becomes higher. In addition, due to contact of the different kind of metal with the copper conductive wiring, a local electric field is generated to readily corrode the contacted part due to the battery effect, which inevitably brings about a problem such that the long-term operational reliability of the wiring panel as obtained becomes lowered.

Furthermore, titanium, nickel or other materials is interposed between copper or a copper alloy and polyimide for the purpose of physically separating them, on account of which the film thickness of such other material becomes unavoidably increased. In addition, since titanium or other material has higher resistivity than that of copper or copper alloys, there was also a problem of the electric resistance value of the wiring becoming higher with respect to the inter-layer connection, for example.

SUMMARY OF THE INVENTION

The present invention has been made with a view to solving the above-mentioned various problems, and aims at providing an improved wiring panel having excellent operational reliability over a long period of time, in which the reaction between copper and an organic substance such as polyimide, etc. is suppressed without necessity for interposing substantial other material having a substantial thickness between the electrically conductive member composed of copper as the principal constituent and the insulating member composed of polyimide, etc.

The present invention is concerned with a wiring panel constructed with laminated layers of an insulating member composed of an organic substance and an electrically conductive member principally composed of copper, the wiring panel being characterized in that the insulating member contains therein at least one kind selected from the group consisting of copper, titanium, nickel palladium, and chromium, in the total content of at least 5 ppm; and/or that the electrically conductive member contains therein at least one kind selected from the group consisting of carbon and sulfur, in the total content of 0.01% by weight or above.

That is to say, according to the present invention, in one aspect of it, there is provided a wiring panel constructed with a substrate; an electrically conductive member laminated on said substrate and principally composed of copper; and an insulating member composed of an organic substance, said wiring panel being characterized in that a very small amount of a non-metal element is contained in said electrically conductive member, and that a very small amount of a metal element is incorporated into said insulating member.

With a view to attaining the above-mentioned object, the present invention further aims at providing a method for producing the wiring panel having high operational reliability, the wiring of which can be made up of copper alone or a copper alloy, and which brings about neither deterioration in the polyamic acid precursor on the copper conductive wiring, nor formation of a residual film at the time of the patterning.

As the means for solving the problems as mentioned in the foregoing, the present inventors have found out a method for producing the wiring panel by reforming the surface of copper or a copper alloy wiring member to suppress the electron transfer between copper and polyamic acid precursor.

That is to say, according to the present invention, in another aspect of it, there is provided a method for producing a wiring panel constructed with a substrate, an electrically conductive member provided on said substrate and composed of copper as the principal constituent, and an organic insulating layer covering said electrically conductive member, said method comprising steps of: applying onto the surface of said conductive member a surface-reforming layer which functions to suppress the electron transfer through the surface of said electrically conductive member; and thereafter forming said insulating layer on said electrically conductive member.

The foregoing objects, other objects as well as the specific construction of the wiring panel and the method for its production according to the present invention will become more apparent and understandable from the following detailed description thereof, when read in conjunction with the accompanying drawing showing preferred embodiments thereof.

BRIEF DESCRIPTION OF THE ACCOMPANYING DRAWINGS

Figure 7:
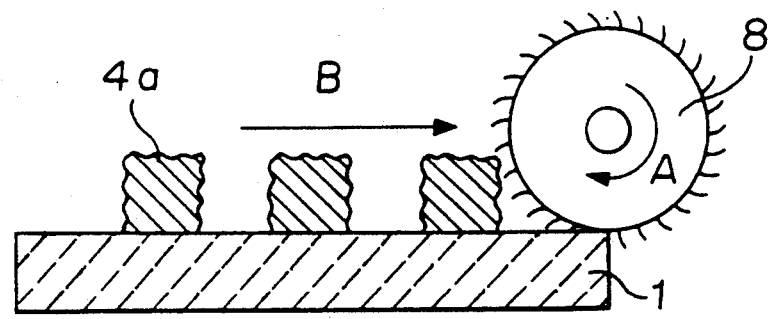
Figure 8:
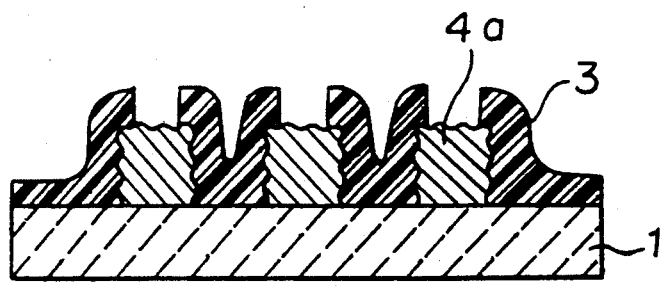
Figure 9:
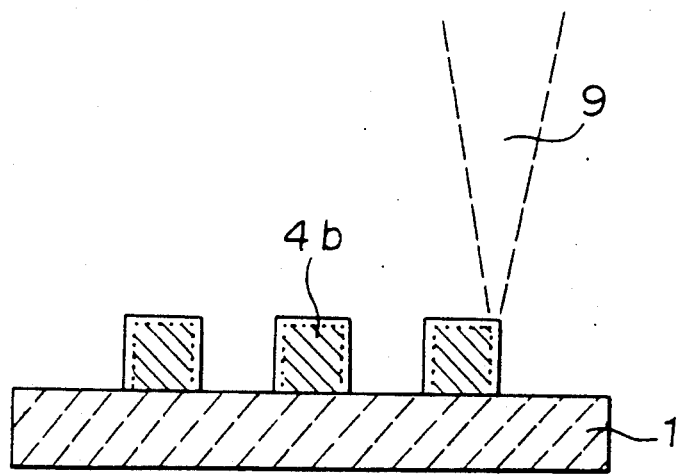
Figure 10:
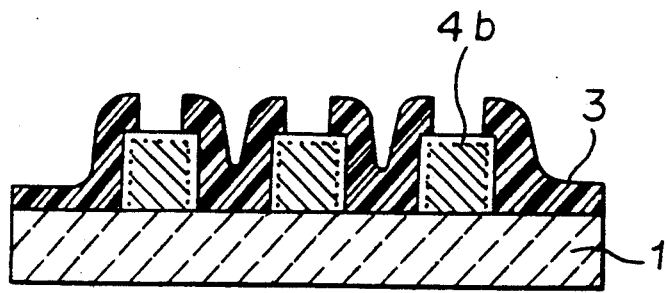
Figure 11:
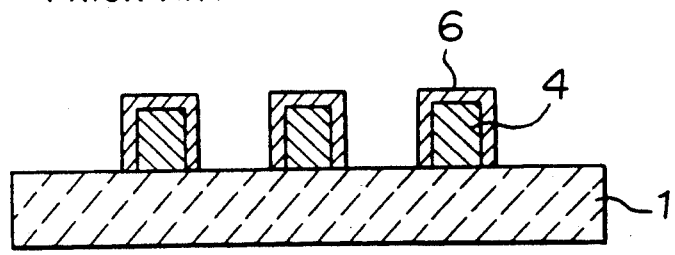
Figure 12:
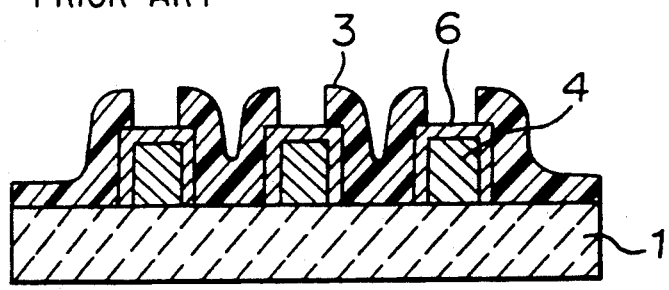
Figure 13:
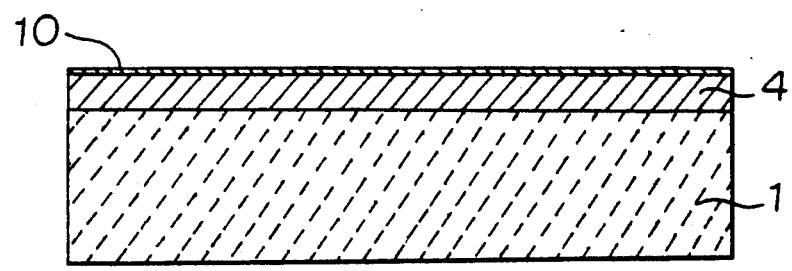
Figure 14:
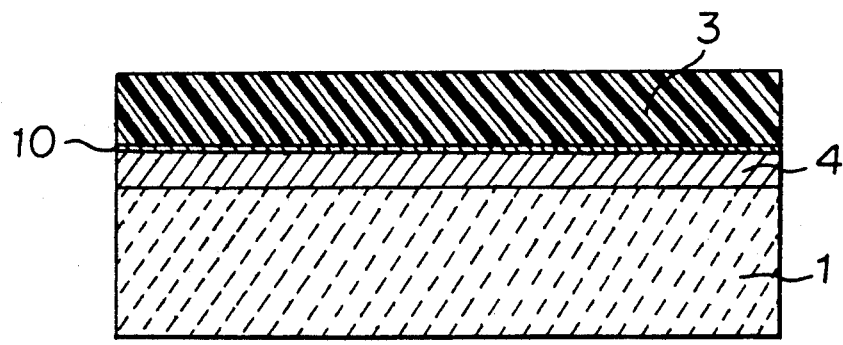
Figure 15:
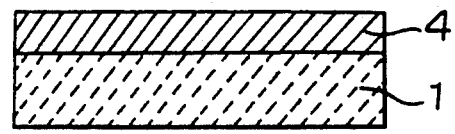
Figure 16:
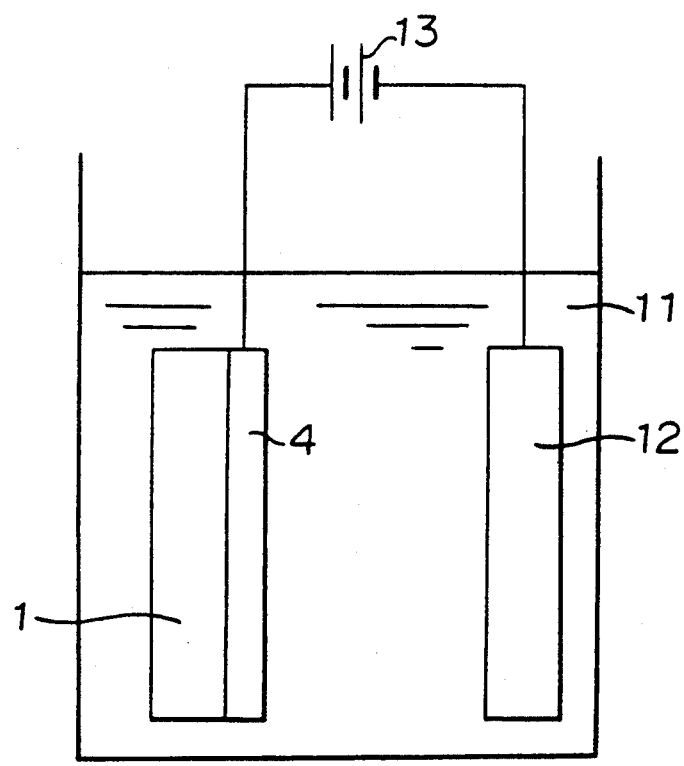
Figure 17:
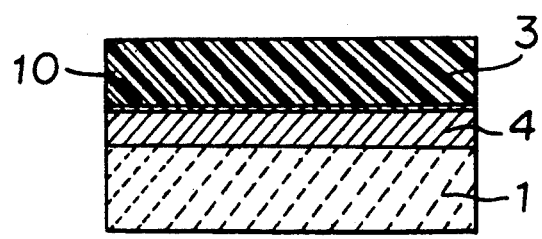

FIGS. 7 and 8 are respectively schematic cross-sectional views illustrating the process steps for producing the wiring panel according to another embodiment of the present invention, wherein FIG. 7 is a schematic cross-sectional view showing one example of mechanically rubbing the surface of the copper conductive wiring, and FIG. 8 is also a schematic cross-sectional view showing the wiring panel after patterning of the polyamic acid precursor film;

FIGS. 9 and 10 are respectively schematic cross-sectional views illustrating the process steps for producing the wiring panel according to still another embodiment of the present invention, wherein FIG. 9 is a schematic cross-sectional view showing one example of heating and quenching the surface of the copper conductive wiring, and FIG. 10 is a schematic cross-sectional view showing the wiring panel after patterning of the polyamic acid precursor film;

FIGS. 11 and 12 respectively show the sequential process steps for producing the conventional wiring panel, wherein FIG. 11 is a schematic cross-sectional view showing the wiring panel after formation of a different kind of metal film on the surface of the copper conductive wiring, and FIG. 12 is also a schematic cross-sectional view showing the wiring panel after patterning of the polyamic acid precursor film;

FIGS. 13 and 14 are respectively cross-sectional views showing the sequential process steps of one embodiment of the method for producing the wiring panel according to the present invention; and FIGS. 15, 16 and 17 are the schematic illustrations of the sequential process steps for the production of the wiring panel according another embodiment of the present invention.

DETAILED DESCRIPTION OF THE PREFERRED EMBODIMENTS

Of various wiring panels according to the present invention, explanations will first be given as to a wiring panel constructed with laminated layers of an insulating member composed of an organic substance, and an electrically conductive member composed of copper as the principal constituent and at least one kind of element selected from carbon and sulfur in its total content of 0.01% by weight or above (hereinafter called "first wiring panel").

The organic substance constituting the insulating member should preferably have low dielectric constant and high heat-resistance. Examples of such organic substance are polyimide, epoxy resin, fluorine resin, and so forth. Of these, polyimide possesses excellent capability for the insulating member to constitute the wiring panel according to the present invention, such that it has heat resistance of 300° C. or above, high chemical stability, high electric insulation, low dielectric constant, and so on.

Since this first wiring panel contains, in its electrically conductive member composed of copper as the principal constituent, at least one kind of element selected from carbon and sulfur, possible reaction between copper and the above-mentioned organic substance constituting the insulating member can be well suppressed.

The total content of carbon and/or sulfur in the above-mentioned electrically conductive member is 0.01% by weight or above, or preferably 2% by weight or below. When the content is below 0.01% by weight, the effect of suppressing the reaction between copper and the organic substance can no longer be obtained sufficiently.

The first wiring panel can be produced by repeating the process step of forming the insulating layer and the process step of forming the electrically conductive layer for a desired number of times, during which process steps a required patterning is effected to both layers of insulating member and electrically conductive member.

There is no particular limitation to the method of forming the above-mentioned insulating layer, and any ordinary method of forming can be employed. For instance, in the case of the insulating member composed of polyimide, varnish containing therein polyamic acid is applied to the electrically conductive member, followed by heat-treating the same to convert it into polyimide.

There is also no particular limitation to the method of forming the above-mentioned electrically conductive layer, and any ordinary method of forming can be employed. Examples of such forming methods are vacuum deposition method, plating method, and so forth, of which the vacuum deposition method can be further classified into the following: a vacuum deposition method using copper material containing therein carbon and sulfur [method (a)]; a vacuum deposition method by introduction of an organic gas or a sulfide gas into the vacuum [method (b)]; a vacuum deposition method, by which copper, carbon, and sulfur, or a compound containing therein carbon and sulfur are simultaneously vapor-deposited in one and the same vacuum-deposition device [method (c)]; and so forth. The content ratio carbon and sulfur in the electrically conductive member can be controlled by adjusting the operating conditions in each of these methods.

There is no particular limitation to the copper material containing therein carbon and sulfur, for use in the above-mentioned method (a). Examples of such copper material are: copper material with increased content of carbon; copper material containing therein at least 0.01% by weight of copper sulfide in terms of conversion into sulfur; and others.

As the organic gas for use in the above-mentioned method (b), there may be exemplified methanol ($CH_3OH$), ethanol ($C_2H_5OH$), acetone ($CH_3COCH_3$), and so forth. Example of the sulfide gas also for use in the method (b) are: hydrogen sulfide ($H_2S$), sulfur dioxide ($SO_2$), and others.

As the materials for the evaporative deposition to be used in the above-mentioned method (c), there may be exemplified graphite (C), sulfur (S), ammonium persulfate (($NH_4)_2 S_2O_8$), and other organic compounds represented by a general formula of $C_aH_bO_cN_d$ (where each of a, b, c and d is an arbitrary integer).

As the plating method, there may be exemplified a method of incorporating, into a plating liquid, an organic substance or a compound containing therein sulfur. Examples of the organic substance are: gelatin, casein, and other proteins; glucose and other saccharides; phenols; phenol sulfonic acid; and so forth. Examples of the sulfur-containing compound are: sulfuric acid ($H_2SO_4$), copper sulfate ($CuSO_4$), sodium thiosulfate ($Na_2S_2O_3$), potassium thiocyanate (KCNS), and so forth.

Figure 1:
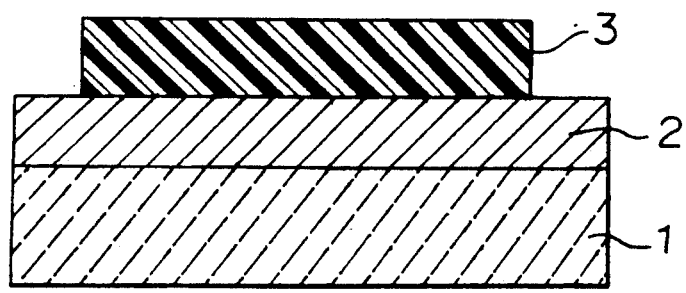
FIGS. 1 and 2 are respectively schematic cross-sectional views showing preferred embodiments of the wiring panel according to the present invention.

FIG. 1 illustrates one example of the first wiring panel according to the present invention, which is constructed as mentioned above. In the drawing, a reference numeral 1 designates a substrate, a numeral 2 refers to an electrically conductive member composed of copper as the principal constituent and 0.01% by weight or more of carbon and/or sulfur, and a numeral 3 refers to an insulating member composed of polyimide. By the way, it should be noted that the wiring panel according to the present invention can be made into a multi-layered structure, depending on necessity, by sequentially repeating the above-mentioned laminating steps.

In the following, explanations will be given as to another type of the wiring panel (hereinafter called "second wiring panel") constructed with laminated layers of: an insulating member composed of an organic substance and at least one kind of an element selected from copper, titanium, nickel, palladium and chromium (hereinafter referred to as "particular element") in the total content of 5 ppm or above; and an electric conductive member principally composed of copper.

For this second wiring panel, those organic substances same as used for the above-mentioned first wiring panel may also be employed, of which polyimide is particularly preferable.

In this second wiring panel, since the particular element as mentioned above is contained in the insulating member, possible reaction between copper and the organic substance such as polyimide, etc. can be suppressed.

This particular element is to be contained in the above-mentioned insulating member in its total content of at least 5 ppm, or preferably 0.5% by weight or below. When the ratio does not reach 5 ppm, the effect of suppressing the reaction between copper and the organic substance can no longer be obtained sufficiently.

In this second wiring panel, the electrically conductive member composed of copper as the principal constituent may be the same as those used in the conventional wiring panel.

Thickness of both insulating layer and electrically conductive layer may also be same as that in the fist wiring panel.

There is no particular limitation to the method of forming the insulating layer at the time of producing the second wiring panel according to the present invention. The following are the preferred methods in the case of using polyimide, for example, as the organic substance for the insulating layer: a method, in which varnish containing therein polyamic acid with further content of 5 ppm or above of the particular element is applied to a predetermined film thickness, and then the coating as applied is subjected to heat-treatment at about 350° C. in the nitrogen atmosphere to convert polyamic acid into polyimide [method (d)]; a method, in which, after the film of polyamic acid has been converted into polyimide film, it is exposed to a gas or a liquid containing therein the particular element to thereby dope the polyimide film with the particular element [method (e)]; and a method, in which, after the film of polyamic acid has been converted into polyimide film, ions of the particular element is accelerated and injected into the polyimide film [method (f)]. The content ratio of this particular element in the insulating member can be controlled by adjusting the operating conditions in each of these methods.

The particular element to be used in the abovementioned method (d) may either be contained in the varnish in its ionic state, or be contained therein by its substitution with a part of polyamic acid.

As the gas containing therein the particular element, for use in the abovementioned method (e), there may be exemplified a gas of organic metal such as nickel carbonyl ($Ni(CO)_4$), etc. containing therein such particular element. Also, examples of the liquid containing therein the particular element are solutions of copper sulfate ($CuSO_4$), titanium chloride ($TiCl_4$), palladium chloride ($PdCl_2$), sodium chromate ($Na_2CrO_4$), nickel sulfate ($NiSO_4$), and others.

In the abovementioned method (f), the material containing therein the particular element is heated to vaporize. and then such gaseous material is subjected to ionization treatment and mass separation treatment, after which ions of the particular element may be accelerated in the electric field.

The abovementioned layer of the electrically conductive member may be formed in accordance with any of those conventionally practiced methods.

Figure 2:
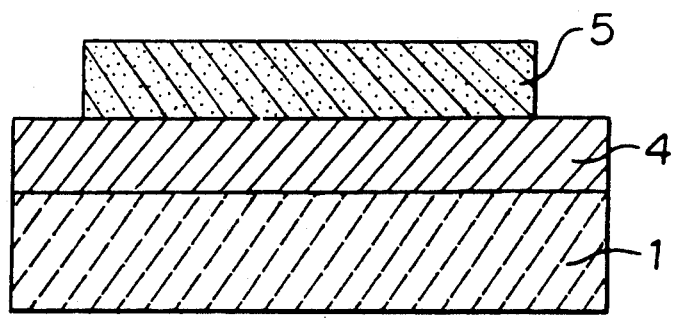
Figure 3:
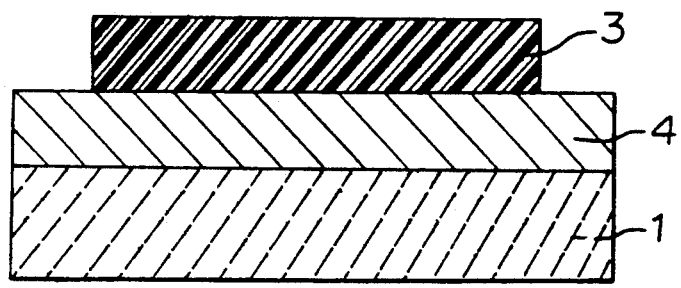
FIG. 3 is a schematic cross-sectional view of a conventional wiring panel which is constructed with a copper layer and a polyimide layer.
Figure 4:
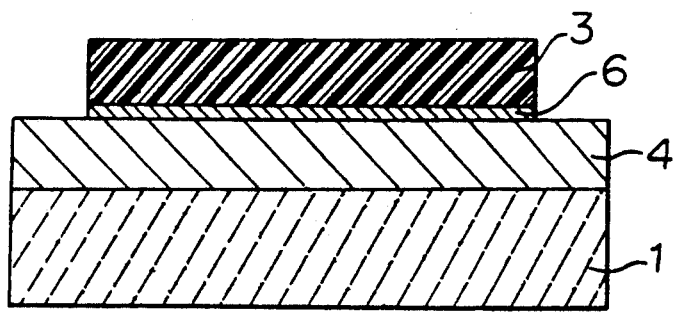
FIG. 4 is a schematic cross-sectional view of a conventional wiring panel, in which a layer of other material is inserted between the copper layer and the polyimide layer.

FIG. 2 illustrates one example of the second wiring panel according to the present invention, which is constructed as described in the preceding. In the drawing, a reference numeral 1 designates the substrate, a numeral 4 refers to the electrically conductive layer composed of copper as the principal constituent, and a numeral 5 refers to the polyimide layer containing therein 5 ppm or more of the particular element. This second wiring panel can also be made into a multi-layered structure, depending on necessity, by sequential repetition of the afore-described lamination steps. Further, depending on necessity, it may be feasible to combine the electrically conductive member composed of copper as the principal constituent and at least one kind of element selected from carbon and sulfur in its total content of 0.01% by weight or above, and the insulating member containing therein 5 ppm or more of the particular element.

In the present invention, the element to be contained in the insulating member may be those other than copper, titanium, nickel, palladium, and chromium; also, the element to be contained in the electrically conductive member may be those other than carbon and sulfur. Such other elements may be used equally so far as they have the equivalent function to these elements.

With the wiring panel according to the present invention, undesirable reaction between the organic substance and copper during the high temperature processing can be remarkably suppressed, whereby the wiring panel as obtained increases its operational reliability, and also suppresses increase in its electric resistance.

The production of the wiring panel according to the present invention, having a substrate, a copper conductive wiring provided on this substrate, and an insulating layer composed of an organic substance and covering the copper conductive wiring, can be done by reforming the surface of the above-mentioned copper conductive wiring so as to suppress electron transfer through its surface, followed by forming the abovementioned insulating layer on the copper conductive wiring.

As the method for surface-reforming of the copper conductive wiring to suppress the electron transfer through its surface, there may be adopted one, in which a substance having the electron-capturing function is adsorbed onto the surface of the copper conductive wiring; or one, in which the surface of the copper conductive wiring is rubbed by mechanical means; or one, in which the surface of the copper conductive wiring is subjected to heating and quenching.

Examples of the organic substance to constitute the insulating layer are polyimide, epoxy resin, fluorine resin, etc., as already mentioned in the foregoing. Of these, polyimide resin is particularly preferable, hence, in the ensuing explanations, the polyimide resin will be taken as an example, for the sake of convenience.

By the surface-reforming of the copper conductive wiring according to the present invention, the chemical interaction between copper and polyamic acid precursor is suppressed, hence deterioration in the polyamic acid precursor on the copper conductive wiring and formation of a residual film during the patterning can be suppressed.

That is to say, the substance having the electron-capturing function, which has been adsorbed on the surface of the copper conductive wiring, suppresses the chemical interaction between copper and the polyamic acid precursor due to its remarkable suppression of the electron transfer between them.

Also, by mechanical rubbing of the surface of the copper conductive wiring, or by heating and quenching the same, the surface defect density having the electron-capturing function is increased, whereby the electron transfer between copper and the polyamic acid precursor is considerably suppressed, hence the chemical interaction between them can be restrained.

The abovementioned surface-reforming of the electrically conductive member composed of copper as the principal constituent can be achieved by forming a metal hydroxide film on the surface of copper or a copper alloy.

It is also feasible that copper or a copper alloy is immersed into an electrolytic liquid, and then electric field is applied to the opposite electrode to thereby produce the reformed film on the surface of copper or a copper alloy.

Since the polyimide resin layer is formed after formation of the metal hydroxide film on the surface of copper or a copper alloy, the metal hydroxide film suppresses chemical reaction between copper or a copper alloy and the polyamic acid precursor. Thickness of the metal hydroxide film is substantially negligible, because it is only sufficient that this metal hydroxide film exhibits the chemical function with respect to the surface of copper or a copper alloy, and that the metal hydroxide is present in a rich state on the surface of copper or a copper alloy. On account of this, the electric resistance value of the wiring does not become high.

In other aspect, copper or a copper alloy is immersed into electrolytic solution, and then an electric field is applied to the opposite electrode to form the reformed film on the surface of copper or a copper alloy, after which the polyimide resin film is formed. On account of this, the reformed film suppresses the chemical reaction between copper or a copper alloy and the polyamic acid precursor. Since the thickness of the reformed film is substantially negligible, the electric resistance value of the wiring does in no way increase.

In the following, the method for producing the wiring panel according to the present invention will be explained in reference to a preferred embodiment shown in the drawing.

Figure 5:
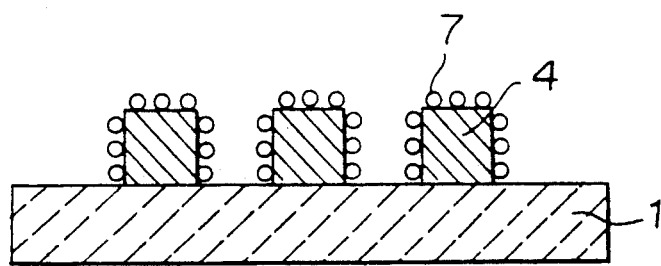
FIGS. 5 and 6 are respectively schematic cross-sectional views illustrating the sequential process steps for producing the wiring panel according to one embodiment of the present invention.
Figure 6:
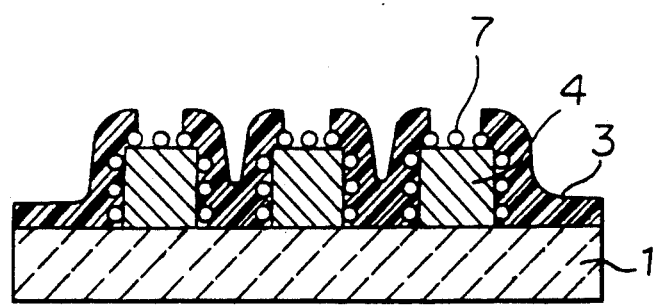

Referring to FIGS. 5 and 6 illustrating respectively schematic cross-sectional views of the sequential process steps for producing the wiring panel according to one embodiment of the present invention, a reference numeral 1 designates the substrate (in this case, a ceramic substrate), a numeral 4 refers to the copper conductive wiring, a numeral 3 refers to the polyamic acid precursor film patterned on the copper conductive wiring 4, and a reference numeral 7 denotes a substance having the electron-capturing function, as adsorbed onto the surface of the copper conductive wiring 4 (in this case, palladium ions).

As shown in FIG. 5, after formation of the copper conductive wiring 4 on the ceramic substrate 1, palladium ions 7 are adsorbed onto the surface of the copper conductive wiring 4 by, for example, immersing the copper conductive wiring on the substrate for about five minutes in a mixed solution of palladium chloride and hydrochloric acid. Thereafter, as shown in FIG. 6, the polyamic acid precursor film 3 is formed on the wiring panel to carry out its patterning on the copper conductive wiring 4.

In this case, since palladium ions 7 as adsorbed onto the surface of the copper conductive wiring 4 possess their electron-capturing function, the electron transfer between copper and the polyamic acid precursor can be suppressed considerably. As the consequence, no remarkable chemical interaction takes place between copper and the polyamic acid precursor, hence there is no deterioration in the polyamic acid precursor 3 on the copper conductive wiring 4 as well as formation of a residual film during the patterning thereof. In addition, the insulating capability of the polyimide proper was obtained, which could be maintained sufficiently even when the polyimide resin is used as the interlayer insulating film in the case of multi-layered wiring, and no discoloration of polyimide could be observed, hence there was no problem at all in its outer appearance. Furthermore, unlike the conventional wiring panel, since the wiring panel according to the present invention has no different kind of metal film interposed between copper and the polyimide, and the wiring conductor is made up of copper alone, undesirable corrosion of the wiring conductor due to the battery effect to occur locally between the different kinds of metal, hence lowering in the operational reliability can be prevented, and there can be obtained the wiring panel having high operational reliability.

FIGS. 7 and 8 illustrate another example of producing the wiring panel according to the present invention. FIG. 7 is a schematic cross-sectional view showing one example of the method, in which the surface of the copper conductive wiring is mechanically rubbed, while FIG. 8 is a schematic cross-sectional view showing the wiring panel after the copper conductive wiring has been patterned with the polyamic acid precursor film. In the drawing, a reference numeral 1 designates the ceramic substrate, a reference numeral 3 denotes the polyamic acid precursor film patterned on the copper conductive wiring 4a, the surface of which has been mechanically rubbed, and a numeral 8 refers to a roller with nylon flocked cloth having been provided on its surface.

After forming the copper conductive wiring on the ceramic substrate 1, the surface of the copper conductive wiring is rubbed by rotating the roller 8 provided on its surface with the nylon flocked cloth, in the arrow direction A, in contact with the wiring panel, while shifting the roller in the arrow direction B, as shown in FIG. 7. Thereafter, as shown in FIG. 8, the polyamic acid precursor film 3 is formed on the wiring panel to carry out the patterning on the copper conductive wiring 4a.

In this case, the surface defect density of the copper conductive wiring 4a increases by rubbing its surface. Since the increased surface defects possess the electron-capturing function, the electron transfer between copper constituting the copper conductive wiring 4a and polyamic acid precursor film 3 is remarkably suppressed. As the consequence of this, there takes place no conspicuous chemical interaction between copper and the polyamic acid precursor film 3, and, same as the above-described example, there takes place no deterioration in the polyamic acid precursor film 3 on the copper conductive wiring 4a and no formation of the residual film during the patterning, hence the insulating capability of the polyimide proper can be obtained. Moreover, since the copper conductive member is made up of simple copper, undesirable corrosion of the wiring conductor, hence lowering in the operational reliability, can be prevented, and the wiring panel of high operational reliability can be obtained.

FIGS. 9 and 10 illustrate further example of producing the wiring panel according to the present invention. FIG. 9 is a schematic cross-sectional view showing one example of heating and quenching the surface of the copper conductive wiring by irradiation of laser beam, while FIG. 10 is a schematic cross-sectional view showing the wiring panel after the patterning of the polyamic acid precursor film. In the drawing, a reference numeral 1 designates the ceramic substrate, a numeral 3 refers to the polyamic acid precursor film patterned on the copper conductive wiring 4b with its surface having been reformed by heating and quenching with use of the laser beam, and a reference numeral 9 designates the laser beam.

After formation of the copper conductive wiring on the ceramic substrate 1, the laser beam 9 is irradiated onto the copper conductive wiring, as shown in FIG. 9. After this, the polyamic acid precursor film 3 is formed on the wiring panel to carry out the patterning on the copper conductive wiring 4b, as shown in FIG. 10. In this case, the surface of the copper conductive wiring 4b is heated by irradiation of the laser beam, and quenched by stoppage of its irradiation. By this series of heating and quenching steps, the surface defect density of the copper conductive wiring 4b increases. Same as mentioned in the above examples, since these increased surface defects have the electron-capturing function, the electron transfer between copper and the polyamic acid precursor is considerably suppressed. Accordingly, no remarkable chemical interaction takes place between copper and polyamic acid precursor, hence there take place no deterioration in the polyamic acid precursor on the copper conductive wiring and no formation of a residual film during the patterning, whereby the polyimide film can maintain its proper insulating capability. In addition, since the wiring conductor is made up of simple copper, corrosion of the wiring conductor, hence decrease in its operational reliability of the wiring panel, can be well prevented, so that the resulting wiring panel maintains its high operational reliability.

In the above-described example of producing the wiring panel according to the present invention, palladium ions 7 are adsorbed onto the surface of the copper conductive wiring 4. It should be noted that such adsorbed substance may be other metal ions, or other substances than the metal ions, provided that such substances possess the electron-capturing function which suppresses the electron transfer between copper and the polyamic acid precursor.

Also, in the above-described example, explanations have been given as to the case where the substrate is of ceramic. It goes without saying that other organic material such as polyimide resin, or inorganic material may also be used for the substrate, attaining the same effect as in the above-described examples.

Further, in the above-described example, the surface of the copper conductive wiring is shown to have been mechanically rubbed with the nylon flocked cloth. It should be noted that the copper surface may also be rubbed by the buff-polishing, etc.

Furthermore, in the above-described example, the surface of the copper conductive wiring is shown to have been selectively heated and quenched by the laser beam. It should be noted that this wiring panel as a whole may be quenched from its high temperature condition by, for example, placing it sequentially in a predetermined high temperature atmosphere and a predetermined low temperature atmosphere.

Incidentally, in the above-described example, explanations have been given as to a case, wherein a part of the copper conductive wiring is shown to have been coated with the insulating layer composed of polyimide resin, i.e., the polyamic acid precursor film is patterned on the copper conductive wiring. It should be noted that, even in the case of requiring no total patterning of the polyamic acid precursor film to cover the entire surface of the copper conductive wiring, there takes place neither deterioration in the polyamic acid precursor, nor discoloration of polyimide resin, hence there can be exhibited the excellent effect same as obtained by the afore-described examples, such that the insulating capability of the polyimide proper is obtainable, and so forth.

As has so far been described in the foregoing, since the present invention is so constructed that a wiring panel constructed with a substrate, a copper conductive wiring provided on this substrate, and an insulating layer covering this copper conductive wiring, wherein the surface of the copper conductive wiring is subjected to the surface-reforming, by adsorption of a substance having the electron-capturing function onto the surface of the abovementioned copper conductive wiring, or by mechanically rubbing the surface of the copper conductive wiring, or by heating and quenching the copper conductive wiring, so as to restrain the electron transfer through the surface of the copper conductive member, and thereafter the insulating layer is formed on the above-mentioned conductive member, it becomes possible to suppress deterioration in the polyamic acid precursor on the copper conductive wiring, and formation of the residual film during the patterning, without interposition of the different kind of metal between copper and polyimide, whereby the insulating capability of the polyimide proper can be obtained, and, at the same time, the wiring conductor can be made up of simple copper, with the consequent effect such that the wiring panel of high operational reliability can be obtained.

In the following, explanations will be given as to other embodiment of producing the wiring panel according to the present invention, wherein the above-mentioned surface-reforming layer is made of a metal hydroxide. Referring now to FIGS. 13 and 14 which are respectively cross-sectional views showing the sequential process steps of the method for producing the wiring panel according to one example of the present invention, a reference numeral 1 designate the substrate (in this case, a ceramic substrate), a reference numeral 4 represents the copper conductive wire, a numeral 3 refers to the polyamic acid precursor film formed on the copper conductive wiring 4, and a numeral 10 refers to a film made of a metal hydroxide formed on the surface of the copper conductive wiring 4 (in this case, copper hydroxide film).

As shown in FIG. 13, after formation of the copper conductive wiring 4, the copper hydroxide film 3 is formed on the surface of the copper conductive wiring 4. As the method for forming the copper hydroxide film, the copper conductive wiring is treated in chlorine gas at a temperature of 100° C. for 10 minutes, and then it is immersed in 10% solution of sodium hydroxide for 10 seconds, or it is heat-treated in oxygen gas at a temperature of 250° C. and a relative humidity of 60%, thereafter, as shown in FIG. 14, the polyamic acid precursor film 3 is formed on the wiring panel, which is patterned depending on necessity. Further, this polyamic acid precursor is heat-treated for its conversion into the polyimide resin.

In this case, since the copper hydroxide film formed on the surface of the copper conductive wiring 4 has its function of suppressing the chemical reaction between copper and the polyamic acid precursor, polyimide in the vicinity of the interface between copper and polyimide does not deteriorate, whereby the electrical insulation and heat-resistance of the polyimide resin proper can be obtained. While the mechanism of suppressing the reaction between copper and polyimide has yet to be clarified, this suppressing effect of the hydroxide is first disclosed in the present invention. In the examples of the present invention wherein use is made of the copper hydroxide film, no different kind of metal is interposed between copper and polyamic acid precursor, unlike what has been done in the conventional technique. Rather, since the wiring conductor is made up of simple copper, it is possible to prevent the wiring conductor from corrosion due to the battery effect occurring locally between the different kinds of metals, and to prevent the wiring panel from lowering its operational reliability, whereby the wiring panel having high operational reliability can be obtained.

With the film of the metal hydroxide having a thickness of 25 Å or below, no conspicuous effect can be derived from its film thickness. Such remarkable effect can be obtained from the film thickness of preferably 50 Å or above. Although, in the above-described example of the present invention, mention has only been made as to the film of copper hydroxide, it should be taken note that the films comprising other metal hydroxides such as nickel, aluminum, iron, titanium, etc., which are different species of metal from copper, can be used for the purpose of suppressing the reaction between copper or a copper alloy and polyimide. Furthermore, in the above-described example of the present invention, two methods have been shown as to formation of the hydroxide of copper. However, other methods may also be employed for the purpose of the present invention.

FIGS. 15, 16 and 17 are respectively schematic cross-sectional views showing the sequential process steps of producing the wiring panel according to other example of the present invention. In the drawing, a reference numeral 1 designates the substrate (in this case, a ceramic substrate), a numeral 4 refers to the copper conductive wiring, a numeral 3 refers to the polyamic acid precursor film formed on the copper conductive wiring 4, a reference numeral 10 represents the surface-reforming film formed on the surface of the copper conductive wiring 4 in accordance with other embodiment of the present invention, a reference numeral 11 denotes electrolytic liquid (in this case, aqueous solution consisting principally of 2% copper sulfate ($CuSO_4$)), a numeral 12 refers to an opposite electrode (in this case, platinum (Pt) which is a noble metal with respect to the copper conductive wiring 4), and a numeral 13 refers to a direct current source with the side of the copper conductive wiring 4 constituting the positive electrode.

After formation of the copper conductive wiring 4 on the ceramic substrate 1, as shown in FIG. 15, it is immersed in the electrolytic liquid 11 and an electric field is applied thereto by use of the power source 13 with the copper conductive wiring 4 being made the positive electrode, and with the opposite electrode 12 being made the negative electrode, as shown in FIG. 16. The voltage for applying the electric field is 1 volt, or preferably 3 volts, or more preferably 10 volts or higher. The time for applying the electric field is one minute, or preferably three minutes, or more preferably 15 minutes or longer. By this treatment, the surface of copper is reformed into light reddish brown. Although, at the present stage, the micro-structure of this surface-reformed portion has yet to be determined accurately, it is assumed that the surface-reforming film 10 on the copper conductive wiring according to the present invention contains therein hydroxide of copper, as is the case with the afore-described embodiment of the present invention, because this surface-reforming film has the effect of suppressing the reaction between copper and polyimide. Thereafter, as shown in FIG. 17, the polyamic acid precursor film 3 is formed on the wiring panel, which is subjected to pattern-formation, depending on necessity. Further, this polyamic acid precursor is converted into polyimide resin by heat-treatment.

In this case, since the surface-reforming film 10 on the surface of the copper conductive wiring 4 possesses its function of suppressing the chemical reaction between copper and polyamic acid precursor, there takes place no deterioration in the polyimide resin in the vicinity of the interface between copper and polyimide, hence the electric insulation and heat-resistance of polyimide proper can be obtained. In the case of this example of producing the wiring panel according to the present invention, no different kind of metal is interposed between copper and polyimide and the wiring conductor is made up of simple copper, unlike what has been done in the conventional technique. As the consequence of this, the wiring conductor can be prevented from its corrosion due to the battery effect to occur locally between the different species of metals, and the wiring panel can be prevented from lowering its operational reliability, hence the wiring panel of high operational reliability can be obtained. In this example, aqueous solution of copper sulfate has been used as the electrolytic liquid, although other electrolytic liquid such as sodium hydroxide (NaOH), and so forth may also be employed for the purpose of the present invention. Further, in this example, the d.c. power source has been used, and it may also be feasible to employ the a.c. power source, pulsating power source, or other power sources.

In these two embodiments of the present invention, only the treatment of the copper conductive wiring on the ceramic substrate has been explained. However, the present invention is not limited to this type of treatment alone, but it is applicable to the treatment of the copper conductive wiring on any type of substrate.

It is further possible that a multi-layered wiring panel made up of the copper conductive wiring and the polyimide resin insulating member can be produced by sequentially repeating the process steps of forming the copper conductive wiring, treating the thus formed copper conductive wiring, forming the polyamic acid precursor film, and heat-treating the polyamic acid precursor, in accordance with the present invention.

By the way, as the method for forming the copper conductive wiring, there may be employed various heretofore practiced methods such as evaporative deposition method, sputtering method, plating method, and so forth.

Furthermore, this formation of the copper conductive wiring may be done by forming a copper film on the substrate, then subjecting the copper film thus formed to the treatment according to manner of the present invention, and thereafter it is subjected to the etching treatment. It should further be noted that the treatment according to the present invention may be effected after formation of the conductive wiring.

As has so far been explained, since the method of producing the wiring panel according to various examples of the present invention is such that polyimide resin is formed after formation of the metal hydroxide film on the surface of copper or a copper alloy, this metal hydroxide film functions to suppress the chemical reaction between copper or a copper alloy and the polyamic acid precursor, hence polyimide in the vicinity of the interface between copper or a copper alloy and polyimide does not deteriorate, whereby the electrical insulation and heat-resistance of the polyimide resin proper can be obtained. In the conventional technique, where titanium, etc. is interposed between copper or a copper alloy and polyimide for physically separating them, the titanium layer should inevitably become thick due to its insertion being for the physical separation. In contrast to this, according to the present invention, it is only sufficient that the metal hydroxide film should have chemical action with respect to the surface of copper or a copper alloy, and that such metal hydroxide should exist in a rich quantity on the surface of copper or a copper alloy, so that thickness of the metal hydroxide film is substantially negligible, hence the electric resistance value of the wiring on the panel can be controlled not to be increased with respect to, for example, the inter-layer connection.

In the method for producing the wiring panel according to another example of the present invention, the surface-reforming film is formed on the surface of copper or a copper alloy by immersing it into the electrolytic liquid, and then applying the electric field onto the opposite electrode, after which the polyimide resin is formed onto the conductive wiring. As the consequence, the surface-reforming film functions to suppress the chemical reaction between copper or a copper alloy and the polyamic acid precursor. Moreover, thickness of the surface-reforming film is substantially negligible, the electrical resistance of the wiring can be controlled not to become increased.

Although, in the foregoing, the present invention has been described with specific details in reference to several preferred examples thereof, the present invention is not limited to these examples alone, but any changes and modifications may be made to various constituent elements and conditions for its production, by those persons skilled in the art, within the ambit of the present invention as recited in the appended claims.

What is claimed is:

1. In a wiring panel constructed with a substrate; an electrically conductive member laminated on said substrate and principally composed of copper; and an insulating member composed of an organic substance, the improvement which comprises incorporating an amount, which is 0.01% by weight to 2% by weight, of a non-metal element into said electrically conductive member.

2. A wiring panel according to claim 1, wherein at least one kind of carbon and sulfur is contained in said electrically conductive member.

3. A wiring panel according to claim 1, wherein said insulating member is polyimide resin.

4. In a wiring panel constructed with a substrate; an electrically conductive member laminated on said substrate and principally composed of copper; and an insulating member composed of an organic substance, the improvement which comprises incorporating amount, which is at least 5 ppm but less than 0.5% by weight, of a metal element into said insulating member.

5. A wiring panel according to claim 4, wherein at least one kind of metal elements selected from the group consisting of copper, titanium, nickel, palladium, and chromium is incorporated into said insulating member of organic substance.

6. A wiring panel according to claim 5, wherein the organic substance constituting said organic insulating member is polyimide.

7. In a wiring panel constructed with a substrate; an electrically conductive member laminated on said substrate and principally composed of copper; and an insulating member composed of an organic substance, the improvement which comprises a metal hydroxide film serving as a surface-reforming layer formed on the surface of said electrically conductive member and functioning to suppress electron transfer through the surface of said electrically conductive member.

8. In a wiring panel constructed with a substrate; an electrically conductive member laminated on said substrate and principally composed of copper; and an insulating member composed of an organic substance, the improvement which comprises a surface-reforming layer formed on the surface of said electrically conductive member, said surface-reforming layer functioning to suppress electron transfer through the surface of said electrically conductive member, wherein said surface-reforming layer comprises a substance having the electron-capturing function, said layer being formed by absorbing said substance onto the surface of said electrically conductive member.

9. In a wiring panel constructed with a substrate; an electrically conductive member laminated on said substrate and principally composed of copper; and an insulating member composed of an organic substance, the improvement which comprises a surface-reforming layer formed on the surface of said electrically conductive member, said surface-reforming layer functioning to suppress electron transfer through the surface of said electrically conductive member, wherein said surface-reforming layer is formed by increasing the surface-defect density of said electrically conductive member.

10. A wiring panel according to claim 7, wherein said insulating member is polyimide resin.

11. A method for producing a wiring panel constructed with a substrate, an electrically conductive member provided on said substrate and composed of copper as the principal constituent, and an insulating layer of an organic substance covering said electrically conductive member, said method comprising steps of applying onto the surface of said electrically conductive member a metal hydroxide film which functions as a surface-reforming layer to suppress electron transfer through the surface of said electrically conductive member, and thereafter forming said organic insulating layer on said metal hydroxide film.

12. A method for producing a wiring panel according to claim 11, wherein said organic insulating substance layer is of polyimide resin.

13. A method for producing a wiring panel constructed with a substrate, an electrically conductive member provided on said substrate and composed of copper as the principal constituent, and an insulating layer of an organic substance covering said electrically conductive member, said method comprising steps of adsorbing into the surface of said electrically conductive member a surface-reforming layer having an electron capturing function which functions to suppress electron transfer through the surface of said electrically conductive member, and thereafter forming said organic insulating layer on said surface-reforming layer.

14. A method for producing a wiring panel constructed with a substrate, an electrically conductive member provided on said substrate and composed of copper as the principal constituent, and an insulating layer of an organic substance covering said electrically conductive member, said method comprising steps of mechanically rubbing the surface of said electrically conductive member to form a surface-reforming layer which functions to suppress electron transfer through the surface of said electrically conductive member, and thereafter forming said organic insulating layer on said surface-reforming layer.

15. A method for producing a wiring panel constructed with a substrate, an electrically conductive member provided on said substrate and composed of copper as the principal constituent, and an insulating layer of an organic substance covering said electrically conductive member, said method comprising steps of heating and quenching the surface of said electrically conductive member to form a surface-reforming layer which functions to suppress electron transfer through the surface of said electrically conductive member, and thereafter forming said organic insulating layer on said surface-reforming layer.

16. A method for producing a wiring panel constructed with a substrate, an electrically conductive member provided on said substrate and composed of copper as the principal constituent, and an insulating layer of an organic substance covering said electrically conductive member, said method comprising steps of immersing the surface of said electrically conductive member into an electrolytic liquid, and then applying electric field to an opposite electrode in said electrolytic liquid, thereby to form a surface-reforming layer which functions to suppress electron transfer through the surface of said electrically conductive member, and thereafter forming said organic insulating layer on said surface-reforming layer.

* * * * *

UNITED STATES PATENT AND TRADEMARK OFFICE
CERTIFICATE OF CORRECTION

PATENT NO. : 5,175,399
DATED : December 29, 1992
INVENTOR(S) : MITSUMASA MORI ET AL It is certified that error appears in the above-identified patent and that said Letters Patent is hereby corrected as shown below:

COLUMN 16, line 18, claim 8, change "absorbing" to --adsorbing--.

line 54, claim 13, change "into" to --onto --.

Signed and Sealed this

Sixteenth Day of November, 1993

Attest:

BRUCE LEHMAN

Attesting Officer      Commissioner of Patents and Trademarks